United States Patent [19]

Hitt et al.

[11] 4,193,063
[45] Mar. 11, 1980

[54] DIFFERENTIAL CAPACITANCE MEASURING CIRCUIT

[75] Inventors: James J. Hitt, Willow Grove; George C. Mergner, Glenside, both of Pa.

[73] Assignee: Leeds & Northrup Company, North Wales, Pa.

[21] Appl. No.: 905,688

[22] Filed: May 15, 1978

[51] Int. Cl.² .................. G08C 19/00; G01R 27/26
[52] U.S. Cl. .......................... 340/200; 324/60 CD
[58] Field of Search ............... 340/200, 186, 187, 210; 324/60 CD, 61 R; 318/662

[56] References Cited

U.S. PATENT DOCUMENTS

| | | | |
|---|---|---|---|
| 2,968,031 | 1/1961 | Higa | 340/200 |
| 3,135,916 | 6/1964 | Tannenbaum et al. | 324/60 R |
| 3,271,669 | 9/1966 | Lode | 324/60 R |
| 3,318,153 | 5/1967 | Lode | 73/398 |
| 3,456,132 | 7/1969 | Dechelotte | 340/210 |
| 3,646,538 | 2/1972 | Frick | 340/200 |
| 3,656,000 | 4/1972 | Neathery | 324/60 CD |
| 3,967,064 | 6/1976 | Sigworth | 340/187 |
| 4,040,041 | 8/1977 | Fletcher et al. | 340/200 |

OTHER PUBLICATIONS

"A Two-wire, 4–20 MA Flow Transmitter Using A Capacitive Sensor," Control Elements Conference, vol. 1, Apr. 30–May 4, 1973, pp. 1–8.

"Mechanical Input Transducers", Instrumentation in Scientific Research, pp. 67–69.

*Primary Examiner*—John W. Caldwell, Sr.
*Assistant Examiner*—James J. Groody
*Attorney, Agent, or Firm*—Raymond F. MacKay; William G. Miller, Jr.

[57] ABSTRACT

The displacement of the diaphragm in a differential pressure sensor of the differential capacitor type produces an output signal substantially linearly related to the displacement. The capacitors are charged in parallel from a constant current source for a fixed period of time and discharged through separate discharge circuits for another fixed period of time. An integrating differential amplifier connected to the two capacitors as they discharge produces an output signal related to the area between the two discharge curves which is substantially linearly related to the extent of displacement of the diaphragm of the differential pressure sensor. The output from the amplifier is used to control the current output from the device.

10 Claims, 1 Drawing Figure

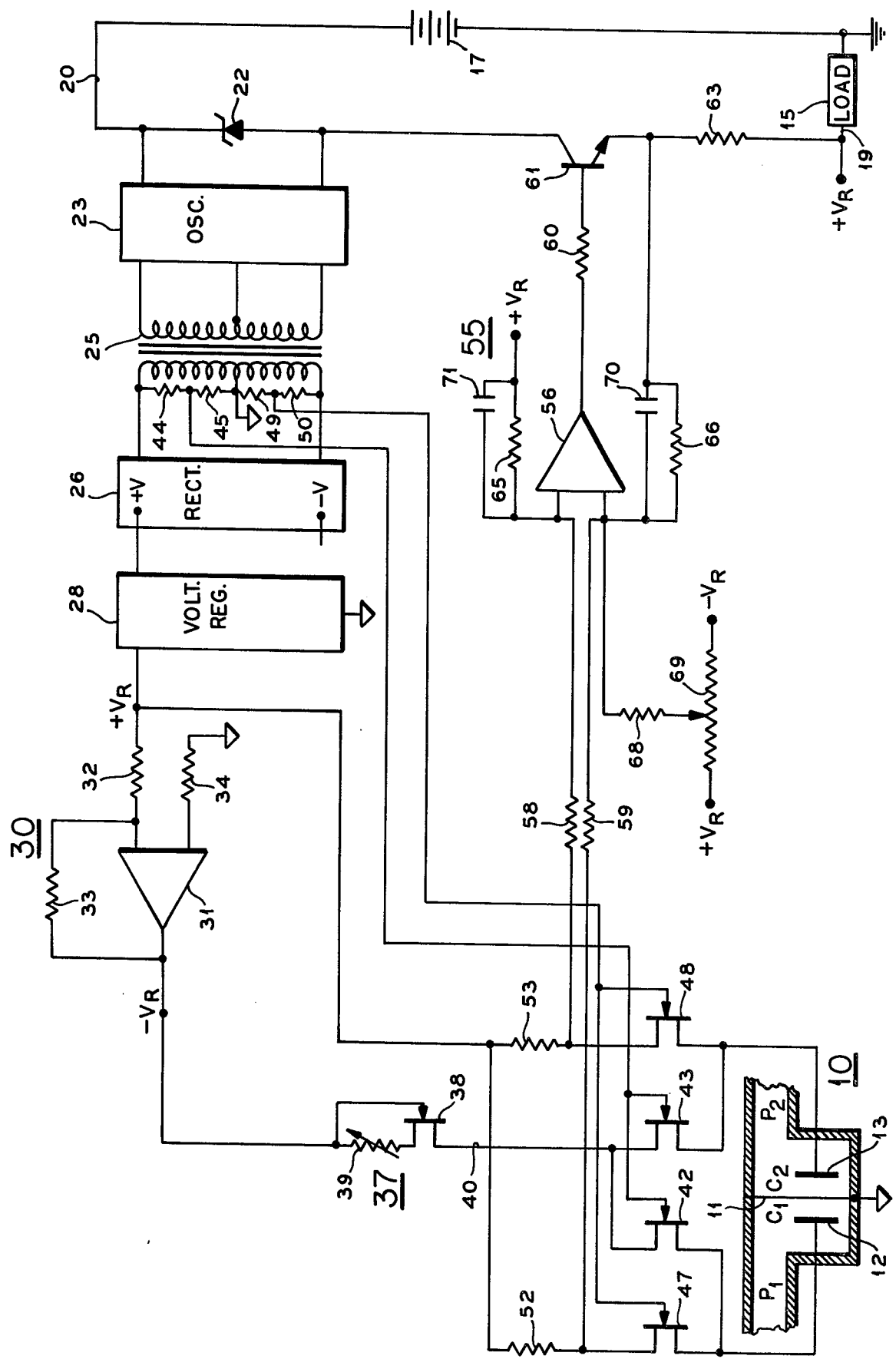

DIFFERENTIAL CAPACITANCE MEASURING CIRCUIT

SUMMARY OF THE INVENTION

This invention relates to differential capacitor measuring systems and more particularly to apparatus for producing an electrical output signal varying substantially linearly with the displacement of the central plate of the differential capacitor.

In order to measure small mechanical displacements, differential capacitor systems are often used. Exemplary of such devices are differential pressure sensors, gravimeters, and accelerometers. In such sensors the displacement of the central plate of the differential capacitor is determined by the change of capacitances between the central plate and the side plates. An electrical signal that is linearly related to the displacement of the central plate may be obtained by including the differential capacitor in an A.C. bridge circuit and measuring the output voltage of the bridge. With such an arrangement, however, it is necessary that the alternating voltage supplied to the bridge be of constant value and have a good waveform. The difficulty in obtaining such a voltage at frequencies that are required has resulted in other arrangements being used for measuring the displacement of the central plate. In such arrangements, there is generally found a feedback loop for controlling the amplitude and/or the frequency of the A.C. signal supplied to the differential capacitor.

Still other prior art systems for measuring changes in relative capacitances of differential capacitors produce an output signal that not only varies with changes in relative capacitances but also vary with the frequency of the signal applied to the capacitor. It is therefore necessary in such systems to employ a voltage source of constant frequency to energize the capacitor to insure that changes in the output from the measuring systems are due solely to changes in the relative magnitude of the capacitance.

From the equations given on page 67 of the book Instrumentation in Scientific Research by K. S. Lion, published by McGraw-Hill, for the variations of capacitance in a differential capacitor upon displacement of the central plate, it can be shown that the quantity $(C_1-C_2)/(C_1+C_2)$ is directly proportional to the displacement of the central plate of a differential capacitor. In accordance with this invention, a quantity varying as the ratio of the difference to the sum of the capacitances is achieved by charging the capacitors from a constant current source for a fixed period of time to a voltage represented by the equation $$V = \frac{it_1}{C_1 + C_2}$$

where i is the constant current and $t_1$ is the time during which the capacitors are charged from the constant source. If, during the discharge cycle, the capacitors are allowed to substantially completely discharge for the same time period, the time integral of the difference of the voltages during the discharge period can be shown to be substantially equal to $$\frac{VR}{t_2}(C_1 - C_2).$$

By substituting for the voltage V in this latter expression its value as defined by the charging cycle equation, it can be seen that the voltage difference for $t_1 = t_2$ is $$iR\frac{(C_1 - C_2)}{(C_1 + C_2)}.$$

Thus, by detecting the voltage difference across the fixed side plates of the differential capacitor, and integrating that voltage difference, the output from the integrator is linearly related to the displacement of the central plate of the differential capacitor.

An object of this invention is to provide an electrical signal which is a linear measure of the displacement of the central plate of a differential capacitor.

It is another object of this invention to provide a system for measuring the relative capacitances of a differential capacitor that is independent of the frequency at which the system operates.

It is another object of this invention to make use of the electrical signal linearly related to the displacement of the central plate of the differential capacitor to provide an output current that is linearly related to the displacement of the central plate.

It is a further object of this invention to provide a two-wire transmitter for producing an output current linearly related to the displacement of the central plate of a differential capacitor wherein the electric power necessary to operate the transmitter is derived from the transmitted current.

Other objects, advantages, and features of this invention will become apparent to those skilled in the art without departing from the scope and spirit of this invention.

BRIEF DESCRIPTION OF THE DRAWING

The FIGURE is a schematic diagram of an embodiment of the invention.

There has been disclosed in the FIGURE a two-wire transmitter for producing a flow of current that is linearly related to the displacement of the central plate of a differential capacitor. For purposes of illustration, a differential capacitor has been illustrated as included within a differential pressure transducer 10, although it must be remembered that such a transducer is only exemplary of one of many types of transducers that employ differential capacitors. As shown, the differential pressure transducer 10 is provided with a diaphragm 11 that forms the central plate of a differential capacitor comprising two capacitors, $C_1$ and $C_2$. The fixed plates of this differential capacitor are shown as plates 12 and 13. As is well known to those skilled in the art, the diaphragm or central plate 11 divides the differential pressure transducer 10 into two chambers and the diaphragm 11 is deflected to the right or to the left in accordance with the relative magnitudes of the pressures applied to the chambers, the pressures being identified as $P_1$ and $P_2$. As shown, the diaphragm or central plate 11 is connected to the outer case of the differential pressure transducer 10, and electrically connected to signal common. Deflection of the central plate 11 produces a change in the capacitances of capacitors $C_1$ and $C_2$, the capacitance of one increasing and the other decreasing depending upon the direction of the deflection of the central plate 11.

The circuit arrangement shown in the FIGURE is provided to produce a flow of current through a load 15 that is linearly related to the displacement of the diaphragm 11 of the differential pressure transducer 10. It is to be understood that the load 15 may be in the form of a resistor to produce a voltage or may be a measuring or control instrument responsive to the flow of current therethrough. Generally the load 15 in process control installations is located at a distance remote from the location of the differential pressure transducer 10 and the circuitry of the FIGURE is connected to the load 15 and its associated power supply 17 by two conductors 19 and 20. As the power required to operate the transmitter is generated by the flow of current through the conductors 19 and 20, it is not necessary for there to be any other electrical connections between the remote location of the differential pressure transducer 10 and the load 15 nor any separate source of power at the location of the differential pressure transducer 10.

The flow of current through a Zener diode 22 produces the operating voltage for the transmitter. The voltage across the Zener diode 22 is applied to a square wave oscillator 23 which may be of any conventional type. While the frequency of the oscillator 23 is selected based upon many parameters of the circuit and transducer, in one embodiment satisfactory operation was accomplished with the oscillator 23 operating at a frequency of 10 kHz. The square wave output of the oscillator 23 is applied to the primary winding of a transformer 25 which serves to isolate electrically the output circuitry of the transmitter from the power supply of the transmitter. The secondary winding of the isolating transformer 25 is connected to apply its voltage to a rectifier 26 which may be a conventional bridge type rectifier for producing a plus and a minus voltage with respect to a signal common to which the center tap of the secondary winding of the isolating amplifier 25 is connected. The positive and negative voltages, $+V$ and $-V$, from the rectifier 26 are used to supply the operating voltages for the various components of the transmitter in manner well known to those skilled in the art.

The positive voltage from the rectifier is applied to a voltage regulator 28 which may be an Analog Devices AD580J. This voltage regulator 28 produces a regulated voltage output, $+V_R$, of $+2.5$ volts. The regulated voltage outptut, $V_R$, from the voltage regulator 28 is applied to an inverter 30 comprising an operational amplifier 31 having an input resistor 32, a feedback resistor 33, and a resistor 34 connecting the other input terminal to signal common. The output from the inverter 30 is a negative regulated voltage $-V_R$ which for equal magnitudes of resistors 32 and 33 has a value of $-2.5$ volts.

The output $-V_R$ from the inverter is connected to a constant current source 37, comprising an FET 38 having its gate connected to the negative regulated voltage $-V_R$ and an adjustable resistor 39 connected between the source electrode and the gate. The current flow from the drain electrode in conductor 40 may be varied by adjustment of the resistor 39. The current is adjusted to a level such that the capacitors $C_1$ and $C_2$ will be charged during this charging period to produce a voltage that is slightly less than $-V_R$. In one embodiment a current of 12.6 microamperes was found satisfactory.

In order to charge the capacitors $C_1$ and $C_2$ from the constant current source 37 for a fixed period of time, a pair of FET switches 42 and 43 are located between the constant current source 37 and the capacitors $C_1$ and $C_2$ respectively. The gate electrodes of FET switches 42 and 43 are shown connected together and to the midpoint between a pair of resistors 44 and 45, serially connected across one-half of the secondary winding of isolating transformer 25. The gate electrodes of FET switches 42 and 43 are therefore subjected to a square wave voltage which turns on the FET switches 42 and 43 whenever the gates are driven positive with respect to signal common resulting in a periodic connection of the capacitors $C_1$ and $C_2$ to the constant current source 37. During the time that the FET switches 42 and 43 are closed, the capacitors $C_1$ and $C_2$ are charged in parallel from the constant current source 37. The constant current source results in a voltage across the capacitors $C_1$ and $C_2$ increasing linearly with time. The magnitude of the voltage V across the capacitors $C_1$ and $C_2$ is expressed as $$V = \frac{(i)(t_1)}{(C_1 + C_2)} \quad (1)$$

where
 i is the constant current from constant current source 37
and
 $t_1$ is the half period of the square wave output from the oscillator 23.

During the other half cycle of the square wave from oscillator 23, FET switches 42 and 43 are turned off and FET switches 47 and 48 are turned on by virtue of the connection of their gate electrodes to the midpoint between a pair of resistors 49 and 50 which produce at their midpoint an alternating square wave voltage which is 180° out of phase with the voltage appearing at the midpoint between resistors 44 and 45. The closing of FET switch 47 completes a discharge path for capacitor $C_1$ through a resistor 52 connected to the positive voltage reference supply $+V_R$. Similarly capacitor $C_2$ is connected at the same time by FET switch 48 through resistor 53 to the regulated voltage supply $+V_R$. While the FET switches 42, 43, 47, and 48 have been illustrated as discrete elements, in practice it has been found that such switches may be incorporated into a single CMOS device identified as a CMOS Quad Bilateral Switch sold by RCA as a 4016. With each of capacitors $C_1$ and $C_2$ connected by resistors 52 and 53 respectively to $+V_R$, the capacitors then each discharge toward $+V_R$ with their voltages varying in accordance with an exponential curve which is determined by the capacitance value of the capacitor and its associated discharge resistance. As the resistors 52 and 53 are of equal value, it is well understood that if the capacitors $C_1$ and $C_2$ are of equal magnitude, that is, if there is no deflection of the central plate 11, the two capacitors will discharge toward $+V_R$ along the same exponential curve and there will be no difference of voltage between the fixed plates 12 and 13. However, if the central plate 11 is deflected in one direction or the other, the exponential discharge curves will be different and will produce a difference in voltage between the fixed plates 12 and 13.

The integrated voltage difference between the two discharge curves may be represented by the following equation:

$$\Delta e = \frac{V_R}{t_2}\left[(C_1 - C_2) - \left(C_1 \epsilon^{\frac{-t_2}{RC_1}} - C_2 \epsilon^{\frac{-t_2}{RC_2}}\right)\right] \quad (2)$$

where

V is the voltage to which $C_1$ and $C_2$ are charged,

R is the value of the resistance of equal valued resistors 52 and 53, and $t_2$ is the discharge time.

If the discharge times are sufficiently long to permit the capacitors to substantially completely discharge to the voltage $+V_R$, then the exponential terms of the above equation for all practical purposes may be ignored and the voltage equation can be represented as follows:

$$\Delta e = \frac{VR}{t_2}(C_1 - C_2) \quad (3)$$

This equation provides the $(C_1-C_2)$ term required to produce the substantially linear response of the output of the transmitter.

By substituting for V in the above equation (3) the expression for V from equation (1) and simplifying the terms the equation for $\Delta e$ becomes $$\Delta e = \frac{iRt_1}{t_2} \frac{(C_1 - C_2)}{(C_1 + C_2)} \quad (4)$$

Where the charging time $t_1$ is equal to the discharging time $t_2$ the equation (4) reduces to $$\Delta e = iR \frac{(C_1 - C_2)}{(C + C_2)} \quad (5)$$

As i is the constant current from the constant current source 37 and R is the fixed discharge resistance of equal-valued resistors 52 and 53, the integrated voltage difference $\Delta e$ is seen to be linearly related to the ratio of $(C_1-C_2)$ and $(C_1+C_2)$.

It will be noted that the equations for the charge and discharge of capacitors $C_1$ and $C_2$ do not include any term corresponding to the frequency at which the FET switches 42, 43, 47, and 48 are switched and thus the integrated voltage difference $\Delta e$ is independent of the frequency of the oscillator 23 that provides the switching voltages for FET switches 42, 43, 47, and 48 provided there is no change in the relation between the charging time $t_1$ and the discharging time $t_2$. While the simplification of equation 2 to equation 3 was based upon the assumption that $t_1$ and $t_2$ were equal, it will be understood that if $t_1$ bears a fixed percentage relation to $t_2$ that the desired results will still be achieved.

As indicated above, the elimination of the exponential terms from equation (2) will have no significant influence on the substantial linearity between the displacement of the diaphragm 11 and the integrated voltage difference $\Delta e$ if the discharge time $t_2$ is sufficiently long to permit the capacitors $C_1$ and $C_2$ to substantially completely discharge. In a typical case where the time $t_2$ is equal to five time constants of the discharge path represented by the resistance of equal-valued resistors 52 and 53 and the capacitance of capacitors $C_1$ and $C_2$, it can be shown that the error in the integrated differential voltage $\Delta e$ will be 0.4% for a displacement of diaphragm 11 by one-tenth of the distance between the undeflected position of diaphragm 11 and one of the fixed side plates 12 and 13. As the deflection of the diaphragm 11 is in most practical applications limited to very small displacements, it can be appreciated that the error arising from ignoring the exponential terms in the equation (2) is indeed small.

To obtain the integrated difference of the voltage between plates 12 and 13, there is provided a differential integrating amplifier 55 including a differential operational amplifier 56, having one of its input terminals connected through an isolating resistor 58 and FET switch 48 to the capacitor plate 13. The other input terminal of differential operational amplifier 56 is connected through an isolating resistor 59 and FET switch 47 to the capacitor plate 12.

The output from operational amplifier 56 is applied through a resistor 60 to the base of a current control transistor 61 for control of the flow of current through a feedback resistor 63, the load 15, the power supply 17, and Zener diode 22. The input terminal of operational amplifier 56 that is connected to the resistor 58 is also connected through a resistor 65 to the $+V_R$ supply. Similarly, the other input terminal of operational amplifier 56 that is connected to resistor 59, is connected through a resistor 66 and feedback resistor 63 to the voltage $+V_R$. It may be considered that resistors 58 and 59 together with resistor 65, 66, and feedback resistor 63, form a rebalanceable network responsive to the voltages at the capacitor plates 12 and 13. In operation, if the voltages at the capacitor plates 12 and 13 are equal during the discharge interval, the input terminals of the operational amplifier 56 will be at the same potential and no flow of current will be required through the feedback resistor 63 to maintain the input terminals of the operational amplifier 56 at the same potential. However, if the voltage at the capacitor plate 13 should become more positive than the voltage at the capacitor plate 12, then the input terminal of operational amplifier 56 connected between the resistors 58 and 65 would become more positive than the input terminal of operational amplifier 56 connected to the junction of the resistors 59 and 66. This voltage difference between the input terminals of operational amplifier 56 would produce an output which, applied through the resistor 60 to the base of the transistor 61, will cause a flow of current through the feedback resistor 63 to cause the potential of the input terminal connected between the resistors 59 and 66 to become more positive so that the input to operational amplifier 56 is again restored to a null or balanced condition.

Inasmuch as the circuit requires at all times a flow of current through the Zener diode 22 to provide the operating voltages for the device, it is obvious that with the voltage at the capacitor plates 12 and 13 of equal magnitude, that a current must continue to flow through the Zener diode 22 and current control transistor 61. In order to ensure that there is provided a flow of current with the diaphragm 11 in an undeflected position, a bias is introduced into one terminal of the differential operational amplifier 56. As shown in the Figure, the terminal of the amplifier connected to the junction of the resistors 59 and 66 is also connected by a resistor 68 to a movable tap of a voltage dividing potentiometer 69 shown connected between $+V_R$ and $-V_R$. In operation the potentiometer tap is adjusted so that with the diaphragm plate 11 in its undeflected position, a current must flow through the feedback resistor 63 to maintain the input of the differential amplifier 56 in a balanced condition.

In order that the current flowing through current control transistor 61 be linearly related to the deflection of the diaphragm plate 11, the operational amplifier 56 must provide an output signal that is an integration of the differential voltage on the capacitor plates 12 and 13. To this end integrating capacitor 70 is shown connected in parallel to the resistor 66. In order to preserve symmetry in the circuit, a capacitor 71 corresponding in capacitance value to said integrating capacitor 70 is shown connected in parallel to the resistor 65.

It should be understood that the invention is not limited to the specific arrangement shown herein and that changes and modifications may be made therein without departing from the scope of the invention.

What is claimed is:

1. In combination with a three plate differential capacitor sensor having a central plate movable between two fixed side plates providing a first and second capacitance means, the improvement for producing an output signal linearly related to the displacement of said central plate comprising:
   a source of constant direct current,
   means for periodically connecting said first and second capacitance means to said source of constant current for a fixed period of time to charge said capacitance means to produce a voltage across each of said capacitance means proportional to the reciprocal of the sum of the magnitudes of said first and second capacitances,
   capacitance discharge means,
   means for connecting said first and second capacitance means to said capacitance discharge means during the interval between said period connection of said first and second capacitance means to said constant direct current, and
   integrating means connected to said first and second capacitance means during the time said capacitance discharge means is connected to said first and second capacitance means and responsive to the difference in voltages of said first and second capacitance means for producing an output signal that is substantially linearly related to the ratio of the difference to sum of the magnitudes of said first and second capacitance means and thereby to the displacement of said central plate.

2. Apparatus for producing an output signal varying in magnitude in accordance with the relative magnitudes of first and second capacitance means comprising:
   a source of constant direct current,
   capacitance discharge means,
   means for periodically connecting said first and second capacitance means to said source of constant direct current for a predetermined time interval to produce an electrical charge in said first and second capacitance means and for connecting said first and second capacitance means to said capacitance discharge means during the interval between said periodic connection of said first and second capacitance means to said constant direct current, and
   output means connected to said first and second capacitance means at least during the time said first and second capacitance means are connected to said capacitance discharge means responsive to the difference in voltage across said first and second capacitance means to produce said output signal.

3. Apparatus as in claim 2 in which said first and second capacitance means are connected in parallel to each other during the time of connection to said source of constant current.

4. Apparatus as in claim 3 in which said connecting means comprises a pair of switched FETs associated with each of said capacitance means, one FET of each pair switching its said associated capacitance means to said source of constant current, the other FET of each pair switching its said associated capacitance means to said discharge means.

5. Apparatus as in claim 3 in which said output means is a differential integrating amplifier means.

6. A transmitter for producing an output current varying linearly in magnitude in accordance with the displacement of the central plate of a differential capacitor with respect to the side plates of said differential capacitor comprising
   a source of constant direct current,
   capacitance discharge means,
   first means for periodically connecting the capacitances between said central plate and said side plates to said source of constant direct current for a predetermined time interval and for connecting said capacitances to said capacitance discharge means between said periodic connections,
   integrating means having an input and an output, said input being connected by said first means to said side plates of said differential capacitor during the time said capacitances are connected to said capacitance discharge means, and
   current control means connected to said output of said integrating means to produce an output current varying as said displacement of said central plate.

7. A transmitter as claimed in claim 6 in which said current control means includes
   a feedback resistor connected to said input of said integrating means to produce a feedback voltage to said input of said integrating means varying with said output current.

8. A transmitter as claimed in claim 7 including
   a Zener diode connected in series circuit with said output current, and
   means connected across said Zener diode for producing an operating voltage to power said transmitter from said output current.

9. A transmitter as claimed in claim 8 in which said means connected across said Zener diode includes:
   a square wave oscillator for producing an alternating voltage, and
   voltage rectifying means connected to said square wave oscillator for producing direct voltages.

10. A transmitter as claimed in claim 9 in which said alternating voltage from said square wave oscillator is connected to said first means to produce said periodic connection.

* * * * *